May 20, 1969 A. A. STRICKER ET AL 3,444,617

SELF-POSITIONING AND COLLAPSING STANDOFF FOR A PRINTED CIRCUIT CONNECTION AND METHOD OF ACHIEVING THE SAME

Filed Nov. 5, 1965

INVENTORS.
WILLIAM J. WALKER
ALFRED A. STRICKER

BY Sughrue, Rothwell, Mion, Zinn & Macpeak
ATTORNEYS.

United States Patent Office 3,444,617
Patented May 20, 1969

3,444,617

SELF-POSITIONING AND COLLAPSING STANDOFF FOR A PRINTED CIRCUIT CONNECTION AND METHOD OF ACHIEVING THE SAME

Alfred A. Stricker and William J. Walker, Wappingers Falls, N.Y., assignors to International Business Machines Corporation, Armonk, N.Y., a corporation of New York Filed Nov. 5, 1965, Ser. No. 506,482
Int. Cl. H05k 3/30
U.S. Cl. 29—626 3 Claims

ABSTRACT OF THE DISCLOSURE

A standoff terminal connection process for a printed circuit board involving a portion of each terminal swaged into deformable sinusoidal cross-sectional configuration with the swaged portion being resiliently and frictionally received by the printed circuit through hole.

This invention relates to an improved method of connecting component leads to printed circuit wiring and more particularly, to a self-positioning and collapsing standoff for spacing the component from the printed circuit panel to facilitate lead terminal soldering without damage to the component carried thereby.

In printed circuit board or panel assemblies, it is conventional to mechanically couple electrical components in a preferred circuit arrangement to the printed circuit board by passing the component lead terminals or pins through apertures carried by the printed circuit panel and immerse the printed circuit panel itself in a bath of molten solder to fill the lead carrying apertures. In such a method, all of the electrical connections between the components and the printed circuit panel are made simultaneously. Some printed circuit panels consist of conductive patterns carried on both sides of the panel, while in the more sophisticated printed circuit panels, the panel itself is formed of sandwich construction utilizing alternate layers of insulative material and conductive patterns with the through holes acting to support the solidified solder to effect internal printed circuit connection, as well as to provide the desired circuit connection between the printed circuit patterns and the electrical component leads. All of the dip soldering techniques to make a component lead connection to the printed wiring, either internally or on both sides of the mounting material for a printed circuit panel, require immersion of the panel, or alternatively, means for ensuring the flow of molten solder upwardly to the top of the through holes to ensure proper circuit connections between the printed circuit patterns and the components carried thereby. In such a case, the physical placement of the components on the upper surface of the printed circuit panel, in contact therewith, resulting in the component itself being destroyed or severely damaged by the excess heat of the molten solder bath.

It has been proposed to mechanically position the components on the printed circuit board with the components spaced slightly from the surface of the board, in standoff fashion, prior to partial or total immersion of the printed circuit board in the molten solder bath. The highly automated printed circuit connection techniques wherein thousands of components are coupled to the printed circuit panel involves the mass movement of the printed circuit panels through a plurality of stations to sequentially receive the various electrical components prior to the single dip soldering technique to securely fix and electrically connect all of the components with respect to the board. Obviously, during movement of the mechanically assembled components and circuit panel prior to the soldering operation a component or components may be dislodged from the board while other components are being subsequently assembled into the board. Components may also become tilted or elevated from the mounting holes as they are slapped or vibrated by the assembler or automated machinery which handles the circuit boards for the soldering processes and immediately subsequent to the actual soldering of the components by the dip soldering methods, the movement of the board from the soldering station may involve inertial or vibrational problems such that the component leads, which may have been properly positioned prior to soldering, are displaced prior to complete hardening of the solder within the printed circuit apertures.

In order to overcome these problems, attempts have been made to lock the component lead within the printed circuit panel holes or apertures, or alternatively, attachments have been made to the lead itself to effect frictional engagement between the lead and the larger diameter hole. Even where the terminal itself is deformed or swaged in an attempt to achieve an integral locking function without the addition of material, the physical movement of the swaged terminal lead into the hole acts to deform the somewhat softer printed circuit panel and the electrical conductive patterns carried thereby, with resulting shorting of the printed circuit itself.

Further, in order to ensure that the component will not be dislodged from its standoff position, it is necessary to deform or swage all of the component terminals and to effect physical contact between each of the terminals and its associated printed circuit aperture or hole.

It is a primary object of this invention to provide an improved self-positioning and collapsing standoff for an electrical component carried by a printed circuit panel in which line or surface contact is achieved between the swaged section of the terminal lead and the printed circuit panel aperture wall.

It is another object of this invention to provide an improved method of assembling an electrical component to an apertured printed circuit panel in standoff fashion in which, by swaging a minimum number of terminal leads, the possibility of printed circuit card deformation is greatly reduced.

It is a further object of this invention to provide an improved standoff connection between an electrical component having a number of wire lead terminals received by an apertured printed circuit panel in which the portion of the terminals received within the apertures employ a swaged configuration providing a high friction interference fit without adversely affecting the printed circuit through the hole during component positioning and collapsing.

It is a further object of this invention to provide an improved standoff printed circuit connection between electrical components and an apertured printed circuit board wherein it is virtually impossible to dislodge the component from the standoff position as a result of normal vibration and inertial forces encountered during automated assembly.

The foregoing and other objects, features and advantages of the invention will be apparent from the following more particular description of preferred embodiments of the invention, as illustrated in the accompanying drawing.

Figures 1, 2, 3, 4, 4A, 5, 6, 7, 8, 9, 10, 11:
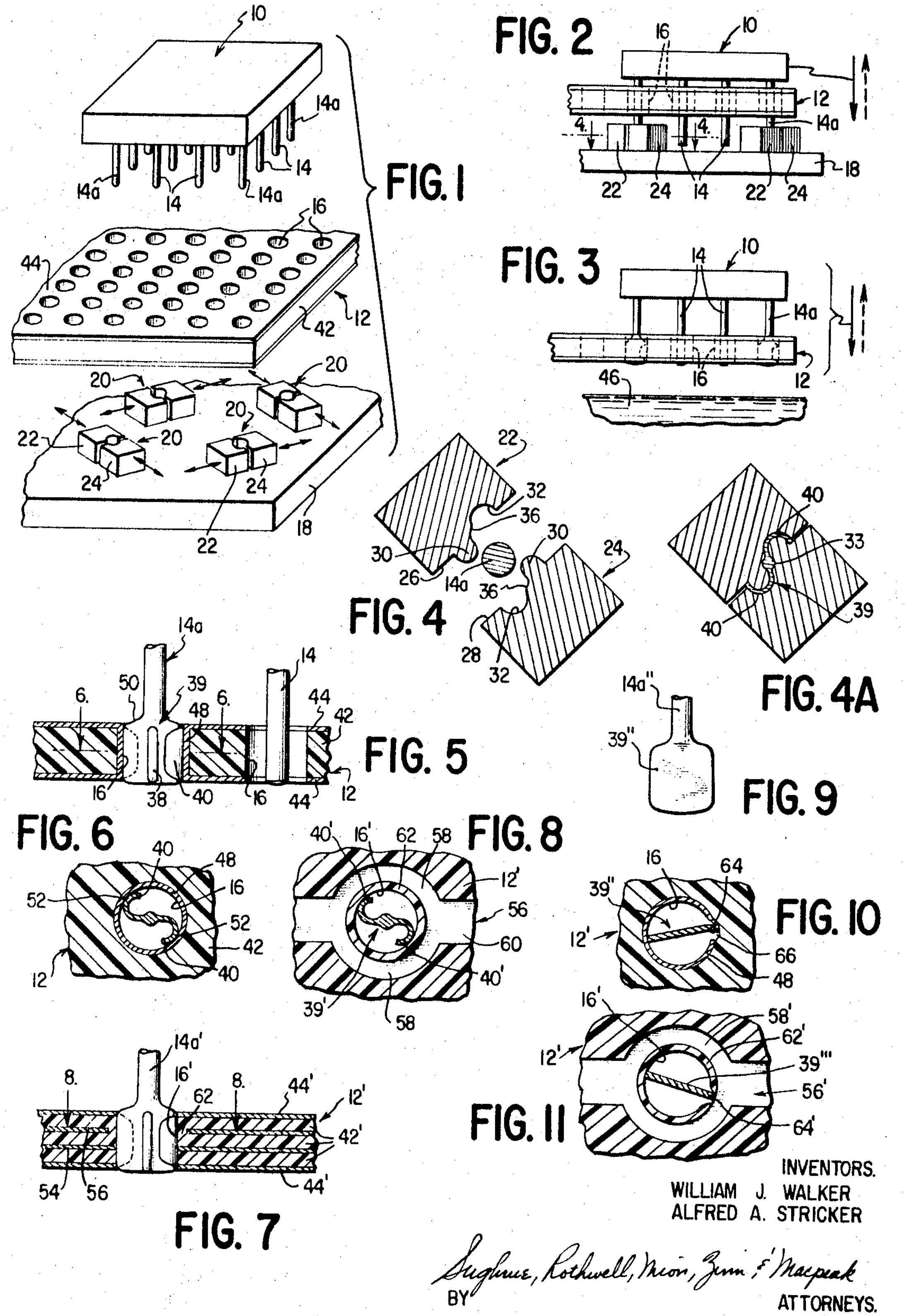
FIGURE 1 is an exploded perspective view of the electrical component, the apertured printed circuit board for receiving the same, and the swaging means for swaging the component terminal leads during the assembly sequence.
FIGURE 2 is a side elevation of the elements shown in FIGURE 1 in position during the first step of the assembly method.
FIGURE 3 is an elevational view of the improved standoff circuit connection of the present invention prior to component soldering.
FIGURE 4 is a sectional plan view of the swaging members shown in FIGURE 1 prior to swaging the inserted end of the component terminal lead.
FIGURE 4A is a sectional plan view of the elements shown in FIGURE 4 subsequent to swaging.
FIGURE 5 is an elevation, in section, of the standoff connection shown in FIGURE 3 prior to soldering.
FIGURE 6 is a plan view of a portion of the standoff connection shown in FIGURE 5 taken about lines 6—6.
FIGURE 7 is an elevational view, in section, of an alternate form of standoff connection of the present invention.
FIGURE 8 is a plan view, in section, of a portion of the standoff connection shown in FIGURE 7 taken about lines 8—8.
FIGURE 9 is an elevational view of a component terminal provided with a flat swage providing an inferior standoff.
FIGURE 10 is a sectional plan view of a standoff connection employing the swaged terminal pin shown in FIGURE 9.
FIGURE 11 is a plan view, in section, of a standoff connection involving a laminated printed circuit panel having internal printed circuitry incorporating the swaged lead terminal of FIGURE 9.

Briefly, the present invention is directed to an improved standoff printed circuit assembly including an electrical component carrying a number of terminal pins or leads which are received in standoff fashion with an apertured printed circuit board. The method of assembly comprises first passing the free ends of the terminal leads through the printed circuit holes. Subsequently, the protruding portions of at least one of the terminal leads is swaged into sinusoidal cross-sectional configuration with the freely expanded sinusoidal portion of the lead being of a larger diameter than its printed circuit receiving aperture. The electrical component carrying the leads is then moved away from the printed circuit panel, whereby the swaged portion of the terminal lead compresses into frictional engagement with the aperture wall forming line or surface contact therebetween. The electrical component is therefore securely positioned in standoff fashion with respect to said printed circuit panel prior to soldering all of the component terminal leads to the printed circuit board.

An alternate method of fabrication may also be employed. Instead of swaging the pins after inserting them through the holes in the panel or circuit board, the pins may be swaged before the insertion step.

Referring to the drawing, FIGURE 1 shows the electrical component 10 positioned above an apertured printed circuit panel 12 such that the component terminal leads or pins 14, which depend downwardly therefrom, are in a position to be received by respective apertures passing through the printed circuit panel 12 to effect the desired standoff connection between component 10 and panel 12. The electrical component 10, in this case, comprises an electronic module which may be of the integrated circuit type, however, the module 10 may be replaced by any conventional electrical or electronic component or subassembly, such as the basic resistor, capacitor or inductor. Positioned below the panel 12 is a fixed table 18 which may form part of a fully automated processing line for assembling a great number of electronic components to a series of apertured printed circuit panels. As indicated, four swaging assemblies 20 are mounted on the upper surface of the table 18 and each comprises a pair of reciprocating dies 22 and 24, respectively, having opposed contact faces 26 and 28, which, when opened, act to receive the protruding tips of the four corner terminal pins or leads indicated at **14*a***.

Of importance to the present invention is the particular configuration given to opposed faces 26 and 28 of the respective reciprocating swaging dies 22 and 24. The central areas of the respective faces 26 and 28 are provided with projecting and recessed portions indicated at 30 and 32, respectively, with the surface formed thereby, of generally sinusoidal configuration, as indicated best in FIGURES 4 and 4A. With the corner terminal leads **14*a* positioned centrally of the opened swaging die, closure of the die sections 22 and 24 by means (not shown) results in deforming the protruding portion 39 of the leads 14*a* into a relatively wide cross-section having a sinusoidal configuration as indicated in FIGURE 4A characterized by opposed, curved resilient end section 40. It is further noted that each of the die sections 22 and 24 is provided with a small recess 36 which acts to produce a central section for the sinusoid of increased thickness as indicated at 38. This gives added strength to the deformed section 38 of the terminal leads 14*a* without interfering with the flexibility of the curved free end sections 40**.

The complete method of assembly may be best seen by further reference to FIGURES 2 and 3. For instance, in FIGURE 2, the module 10 is moved downwardly as indicated by the straight line arrow such that all of the terminal leads 14 and the corner terminal leads **14*a* pass through the respective lead receiving apertures 16 formed within the printed circuit panel 12. In this case, the printed circuit panel 12 comprises a central insulative sheet 42 covered by thin top and bottom sheets 44 formed of conductive material in preferred pattern form. The terminal leads 14 and 14*a* are of such a length as to pass through the apertures 16 with the majority of their length extending beyond the printed circuit panel 12. The extreme outer ends of the terminal leads 14*a* are received within the opening formed by the spaced swaging dies 22 and 24 carried by the table 18. Deformation or swaging of the terminal leads 14*a* is achieved in the manner indicated in FIGURES 4 and 4A to provide a cross-sectional configuration in the form of a sinusoid. The overall width of the sinusoid portion is in excess to the diameter of the holes 16 receiving terminal leads 14*a*. When the module 10 or other electrical component is moved upwardly with respect to the printed circuit panel 12, as indicated in FIGURE 3 by the dotted line arrow, the sinusoidal swaged portions of the terminals are frictionally cammed within their respective apertures to mechanically position the component 10 in standoff fashion with respect to the printed circuit panel. The next step in the assembly process is to dip solder the printed circuit board carrying the component in standoff fashion. This is achieved by moving the printed panel 12 into contact with the molten solder bath 46 and partially immersing the same so that the solder moves upwardly into the through hole 16 carrying both the nonswaged leads 14 and the swaged leads 14*a***.

Reference to FIGURES 5 and 6 shows in detail the standoff printed circuit connection. It is noted that the standoff connection has application to both the through hole plated-type of printed circuit panel in which the panel itself comprises an insulative sheet 42 carrying printed circuit conductive films at 44 on both the upper and lower surface. In this respect, in order to electrically connect one pattern carried by the upper surface to the pattern carried by the lower surface, it is conventional to completely plate the through hole wall as at 48 with a conductive coating, such as copper, prior to assembling of the component to the printed circuit board. The rounded pin section of lead **14*a* joins the swaged section 38 by means of a curved camming section 50 rather than a right angle line of jointure. This facilitates the insertion of the oversized swage portion 39 into the plated through hole which receives it, as indicated in FIGURE 5. In moving upwardly, as indicated in FIGURE 3, the curved surface 50 acts as a camming means tending to move the flexible outer curved sections 40** of the swaged terminal portion 38 causing a reduction in the diameter of the swaged section, also tending to reversely turn the extreme tips of the curved sections 40 as indicated best in FIGURE 6. This actually leaves a small gap between the tip of section 40 and the plated side wall 48. Thus, line or surface contact exists between the resilient terminal section 40 of the swaged portion 39 at the two points 52 in FIGURE 6 and hole wall 48.

Prior to dip soldering, the terminal lead 14 is merely positioned centrally of its aperture 16, as indicated on the right-hand side of FIGURE 5 without any physical contact therebetween. In the embodiment shown in FIGURES 1 through 6 inclusive, for a module 10 carrying sixteen terminal leads, only the four corner leads need be swaged to effect the desired standoff positioning prior to soldering. For even smaller components, a lesser number of terminal leads may be swaged while still ensuring proper standoff position regardless of vibration or inertial problems encountered when moving through a highly automated assembly line.

Reference to FIGURES 7 and 8 shows the application of the standoff connection to a laminated printed circuit panel having both exterior and interior circuitry. In this respect, the panel 12′ is provided with outer conductive layers 44′ in similar manner to the previous embodiment, but instead of one insulative sheet, three separate sheet sections 42′ are provided which act to sandwich internal conductive film layers 54 and 56, respectively. The internal circuitry has a particular pattern which is intersected at certain areas by the through holes 16′. In this case, the through holes 16′ are not the plated through holes. Rather, circuits are completed through the printed circuit patterns carried both exteriorly and interiorly by the molten solder filling through holes 16′ with the panel carrying the electrical components in standoff fashion. The presence of through holes 16′ in the embodiment shown in FIGURE 7 actually forms an exposed circular wall for conductive pattern layer 54 without exposing any of the portion of the internal circuit layer 56. This may best be seen by reference to FIGURE 8 which shows insulative material 12′ carrying a thin film conductive layer 56 having a specific pattern which involves at least one conductive path 60 running longitudinally of the card and being provided, with respect to aperture 16′, a donut-shaped section 58 which surrounds the aperture 16′ but is spaced slightly therefrom so as to provide an annular insulative ring 62 which prevents the conductive terminal lead from making electrical contact with the printed circuit pattern 56 and short-circuiting path 60. Again, it is noted that, upon upward movement of the formed swage section 39′, the tips of the curved flexible ends 40′ are moved inwardly to produce a partial reverse, providing the frictional line or surface contact with the wall of the aperture 16′ in the same manner as in the previous embodiment. The standoff is easily achieved with limited force required and the resiliency of the sinusoidal section is quite effective even under excessive vibration or inertial forces to maintain the electrical component in a preferred position prior to dip soldering and solidification of the soldered printed circuit panel.

The need for a good frictional fit between the standoff portion of the selected terminal pin and the through hole within the printed circuit panel without requiring an excessive force to move the oversized swaged section into position within the printed circuit aperture may perhaps be best appreciated by comparing the highly successful sinusoidal swaged type of standoff of the present invention to earlier attempts to produce an effective mechanical standoff connection. Obviously, various swage configurations given to the portion of the inserted terminal lead prior to moving that portion of the lead into its receiving aperture on the printed circuit panel will provide a force fit of varying degree between the elements and will achieve the desired mechanical standoff. Preliminary investigation led to the most simple standoff arrangement in which the terminal lead is swaged into a thin rectangular paddle type configuration. A pair of opposed blocks having flattened contact surfaces produces such a swaged lead configuration, as indicated in FIGURE 9. In this case, the terminal lead or pin 14a″ is provided with a tip section 39″ having a width which is slightly in excess of either the plated or unplated through holes carried by the printed circuit panel. Reference to FIGURES 10 and 11 shows the effect of mechanically forcing the swaged section 39′ into the through hole for the plated through hole type of panel configuration and the nonplated through hole laminated printed circuit panel 12′, such as the type shown in FIGURES 7 and 8. For example, with a crimped or swaged section about .050 inch wide for a 0.0218 inch diameter wire with the internal diameter of the plated through hole in FIGURE 10 being 0.040 inch plus or minus 0.001 inch, the peak pull in moving the paddle section 39″ upwardly into the plated through holes is in the order of 3½ to 6½ pounds. Not only is this a relatively high force, but the friction results in a tendency to form a toe at one edge, such as 64, while at the same time, the copper through hole plating is ruptured and the contour of the hole itself is distorted. The edges of the crimp or swage are prone to fracture and where they are in contact with the copper plating, the solder is gouged away. Also, after dip soldering and hardening, if an attempt is made to remove the electronic component from the printed circuit panel with the type of crimp or swage shown in FIGURE 10, a peak force of 1 to 2 pounds is required.

Where the flat paddle type of swage is used in a printed circuit panel having internal circuitry, the effect of the nonresilient paddle section as it is pulled into the through hole may be seen in FIGURE 11. Here the paddle section 39‴ itself is not distorted; however, since its width is in excess of the internal diameter of the through hole, the insulation ring 62′ between the conductive ring portion 58′ is cut through or parted to the point where the right-hand edge 64′ of the paddle actually shorts the conductive circuit 56′ carried internally of the panel rather than maintaining the internal circuit section 56′ electrically isolated from the conductive terminal leads or the remaining internal and external printed circuit paths even after solder has completely filled the nonplated through hole 16′. Further, even where all of the leads of the module, such as the 16 leads of module 10, are swaged in the form of the flat paddle 39″ or 39‴, the mechanical bond between the printed circuit panel and the component can still be dislodged as a result of vibration or extreme inertial force. The use of the sinusoidal cross-sectional swage portion with its inherent line or surface contact and flexible frictional engagement not only reduces the number of swaged leads required to securely position the electrical component in standoff fashion with respect to the printed circuit panel, but completely prevents the possibility of rupturing the plated through hole wall or shorting an otherwise insulated internal circuit path.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An improved method of assembling an electrical component having a plurality of terminal leads extending therefrom, in standoff position with respect to an apertured printed circuit panel, comprising the steps of: passing the free ends of said terminal leads through respective printed circuit apertures, swaging the protruding portions of at least one of said terminal leads to form a cross-section characterized by opposed, curved, deformable resilient sections each having an outer surface with a radius of curvature formed in the swaging operation which is greater than one half of said receiving aperture radius and said cross-section having an overall diameter when freely expanded in excess of that of its receiving aperture, and moving said electrical component away from said printed circuit panel to deformably compress said curved resilient sections and engage each swaged said outer surface inwardly of its end with the wall of said aperture, whereby the radius of curvature of each curved section is reduced to less than the radius of the through hole to provide frictional and resilient engagement between said outer surface of the swaged portion and said aperture wall and line contact therebetween to mechanically position the component at a desired distance from said printed circuit panel prior to dip soldering of said assembled printed circuit panel.

2. The method as claimed in claim 1 wherein said swaging step comprises deforming a protruding portion of at least one of said pins into thin sinusoidal cross-section with the free, expanded sinusoidal portion being of a diameter slightly in excess of that of its receiving aperture.

3. An improved method of assembling an electrical component having a plurality of terminal leads extending therefrom, in standoff position with respect to an apertured printed circuit panel, comprising the steps of: passing the free ends of said terminal leads through respective printed circuit apertures, swaging the protruding portions of at least one of said terminal leads to form a cross-section characterized by opposed curved, deformable, resilient sections each having an outer surface with a radius of curvature formed in the swaging operation which is greater than one half of said receiving aperture, and moving said electrical component away from said printed circuit panel to deformably compress said curved resilient sections and engage each swaged curved portion inwardly of its end on the outer surface thereof with the wall of said aperture and reduce its radius to conform to that of the wall, whereby the radius of curvature of each curved section outer surface is equal to the radius of the aperture to provide frictional and resilient engagement between said cross-section and said aperture wall and surface contact therebetween to mechanically position the component at a desired distance from said printed circuit panel prior to dip soldering of the assembled printed circuit.

References Cited

UNITED STATES PATENTS

| | | | |
|---|---|---|---|
| 3,191,271 | 6/1965 | Johnson | 29—630 |
| 3,223,960 | 12/1965 | Ruehlemann | 339—47 X |
| 3,332,912 | 7/1967 | Stricker et al. | 174—52.5 X |

FOREIGN PATENTS

| | | |
|---|---|---|
| 536,836 | 12/1955 | Italy. |
| 968,989 | 7/1961 | Great Britain. |

JOHN F. CAMPBELL, *Primary Examiner.*

R. W. CHURCH, *Assistant Examiner.*

U.S. Cl. X.R.

29—629; 174—68.5, 52.5; 317—101; 339—47